(12) United States Patent
Yanagida

(10) Patent No.: US 8,599,544 B2
(45) Date of Patent: Dec. 3, 2013

(54) ELECTRONIC DEVICE

(75) Inventor: Atsuhiro Yanagida, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 471 days.

(21) Appl. No.: 12/906,959

(22) Filed: Oct. 18, 2010

(65) Prior Publication Data
US 2011/0157788 A1 Jun. 30, 2011

(30) Foreign Application Priority Data
Dec. 25, 2009 (JP) ................................. 2009-296009

(51) Int. Cl.
 *H05K 5/00* (2006.01)
 *H05K 7/00* (2006.01)
 *G06F 1/16* (2006.01)

(52) U.S. Cl.
 USPC .............................. 361/679.27; 361/679.28

(58) Field of Classification Search
 USPC ........................ 361/679.01, 679.27, 679.28
 See application file for complete search history.

(56) References Cited

U.S. PATENT DOCUMENTS

| | | | |
|---|---|---|---|
| 7,463,481 B2 * | 12/2008 | Lev et al. | 361/679.27 |
| 7,564,515 B2 | 7/2009 | Nakajima et al. | |
| 2006/0099494 A1 | 5/2006 | Jung et al. | |
| 2006/0203440 A1 * | 9/2006 | Lev et al. | 361/683 |
| 2007/0285883 A1 * | 12/2007 | Nakajima et al. | 361/683 |
| 2007/0293005 A1 * | 12/2007 | Shigenobu et al. | 438/238 |

FOREIGN PATENT DOCUMENTS

| | | |
|---|---|---|
| JP | S62-119783 | 6/1987 |
| JP | H07-015065 Y2 | 4/1995 |
| JP | 2006-108099 | 4/2006 |
| JP | 2007-179803 | 7/2007 |
| JP | 2007-198483 | 8/2007 |
| JP | 2007-328614 | 12/2007 |
| JP | 2008-003714 | 1/2008 |
| JP | 2008-017112 | 1/2008 |
| JP | 2008-269646 | 11/2008 |

OTHER PUBLICATIONS

Notice of Reasons for Rejection mailed by the Japan Patent Office on Apr. 5, 2011 in the corresponding Japanese patent application No. 2009-296009 in 5 pages.
Notice of Reasons for Rejection mailed by the Japan Patent Office on Jan. 11, 2011 in the corresponding Japanese patent application No. 2009-296009 in 6 pages.
Prior Art Information List in 1 page.

* cited by examiner

*Primary Examiner* — Anthony Haughton
(74) *Attorney, Agent, or Firm* — Knobbe, Martens, Olson & Bear LLP

(57) ABSTRACT

According to one embodiment, an electronic device includes: a first member; a second member overlapped on the first member; a plurality of joints that are spaced apart from each other and that link the first member and the second member at an overlapping portion between the first member and the second member; and a curved rib that is erected on a surface of the second member and that has a curved shape over the surface of the second member in between the joints.

17 Claims, 10 Drawing Sheets

ELECTRONIC DEVICE

CROSS-REFERENCE TO RELATED APPLICATIONS

This application is based upon and claims the benefit of priority from Japanese Patent Application No. 2009-296009, filed Dec. 25, 2009, the entire contents of which are incorporated herein by reference.

FIELD

Embodiments described herein relate generally to an electronic device.

BACKGROUND

Conventionally, an electronic device is known that includes a housing composed of a plurality of members. In such a electronic device, a second member is laminated on a first member and is linked to the first member by a plurality of joints.

However, in such a device, it may be difficult to efficiently enhance the resistance property of the second member in between the joints.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Figure 1:
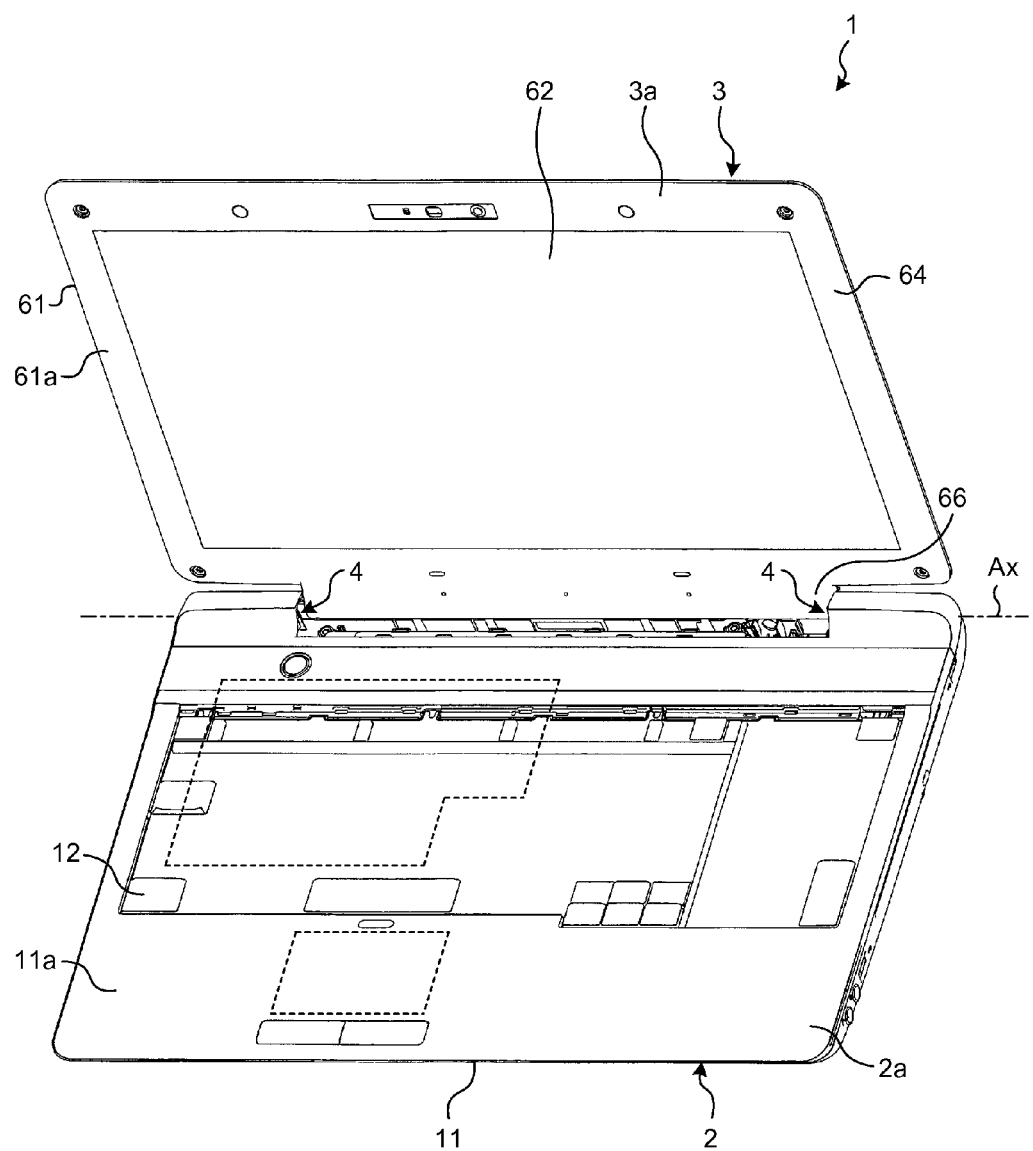
FIG. 1 is an exemplary perspective view of an electronic device according to a first embodiment.
Figure 2:
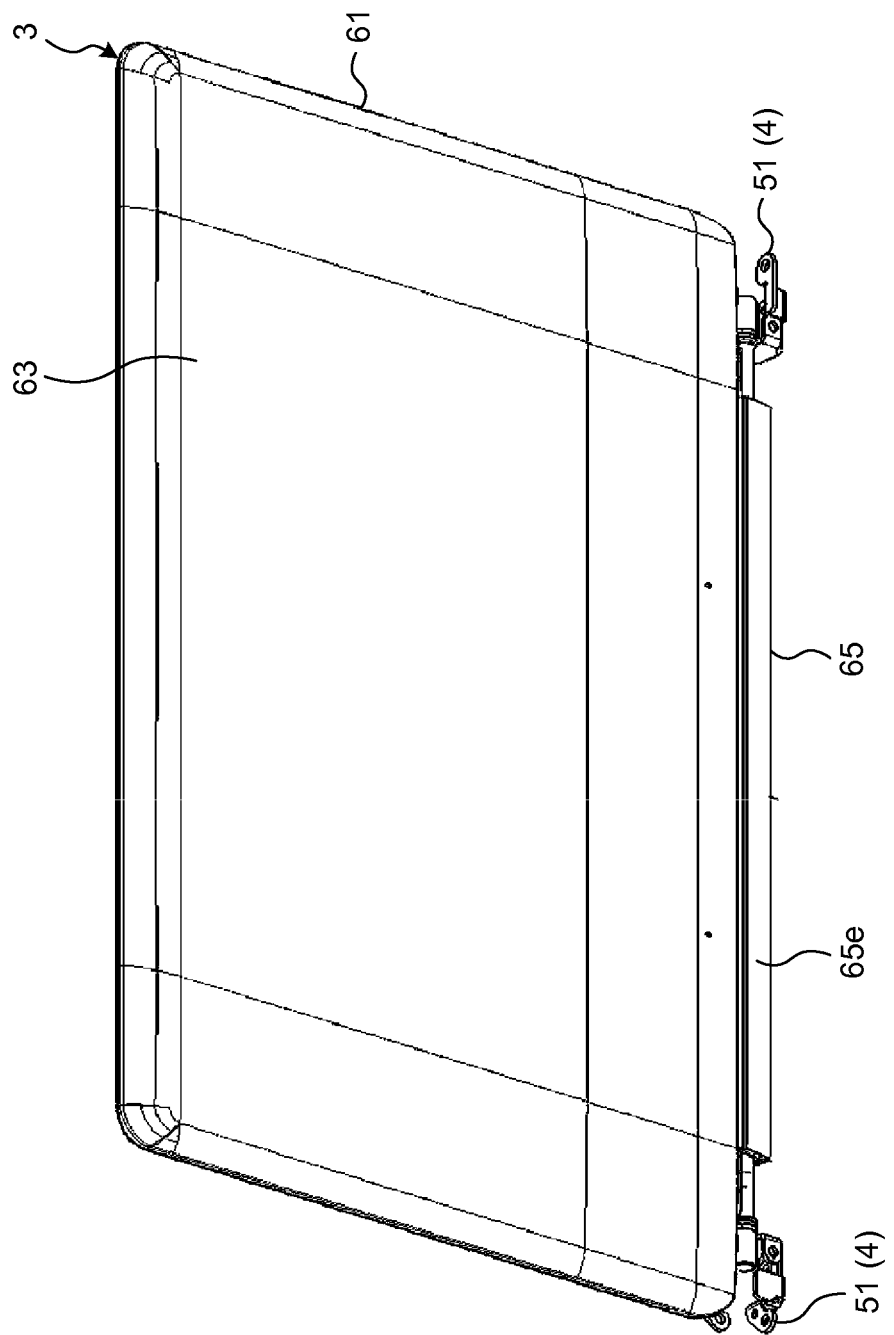
FIG. 2 is an exemplary rear perspective view of a second main body in the first embodiment.

In general, according to one embodiment, an electronic device comprises a first member, a second member, a plurality of joints, and a curved rib. The second member is overlapped on the first member. The plurality of joints are spaced apart from each other and link the first member and the second member at an overlapping portion between the first member and the second member. The curved rib is erected on a surface of the second member and has a curved shape over the surface of the second member in between the joints.

According to another embodiment of the invention, an electronic device comprises a first member, a second member, a plurality of connecting portions, and a rib. The second member is touched to the first member. The plurality of connecting portions are spaced apart from each other and connect the first member and the second member at an overlapping portion between the first member and the second member. The rib is formed in a bending shape and is arranged in between the connecting portions and protrudes from a surface of the second member.

According to still another embodiment of the invention, an electronic device includes a first member, a second member, a first connecting portion, a second connecting portion, and a rib. The second member is touched to the first member. The first connecting portion connects the first member and the second member at an overlapping portion between the first member and the second member. The second connecting portion connects the first member and the second member at a different position of the overlapping portion between the first member and the second member than the first connecting portion. The rib is formed in a bending shape and is arranged in between the first connecting portion and the second connecting portion and protrudes from a surface of the second member.

Various embodiments will be described hereinafter with reference to the accompanying drawings. Throughout the following embodiments, identical constituent elements are referred to by the same reference numerals and repetition in their description is avoided.

First Embodiment

Described below with reference to FIGS. 1 to 10 is an electronic device according to a first embodiment.

As illustrated in FIG. 1, an electronic device 1 according to the present embodiment is configured as a notebook-sized personal computer that comprises a first main body 2 having a flat rectangular shape and a second main body 3 having a flat rectangular shape. The first main body 2 and the second main body 3 are hinged around a rotation axis Ax by a hinge mechanism 4 in such a way that the mutually relative rotation of the first main body 2 and the second main body 3 makes the electronic device 1 enter at least a folded state (not illustrated) and an open state (see FIG. 1).

A housing 11 of the first main body 2 houses therein a substrate on which are mounted a central processing unit (CPU), a read only memory (ROM), a random access memory (RAM), and other electronic components; houses therein a hard disk; and houses therein a cooling fan. On a top surface 2a of the first main body 2, a keyboard 12 is disposed as an input operation module. Similarly, on a top surface 3a of the second main body 3, a display (such as a liquid crystal display (LCD)) 62 is disposed as a display module. In the folded state of the electronic device 1, a top surface 11a of the housing 11 of the first main body 2 faces a top surface 61a of a housing 61 of the second main body 3 and the keyboard 12 faces the display 62. On the other hand, in the open state of the electronic device 1 as illustrated in FIG. 1, the top surface 11a, the top surface 61a, the keyboard 12, and the display 62 are exposed. When in the open state, the electronic device 1 can be operated by a user. Meanwhile, the keyboard 12 and the display 62 are also electronic components.

Figure 3:
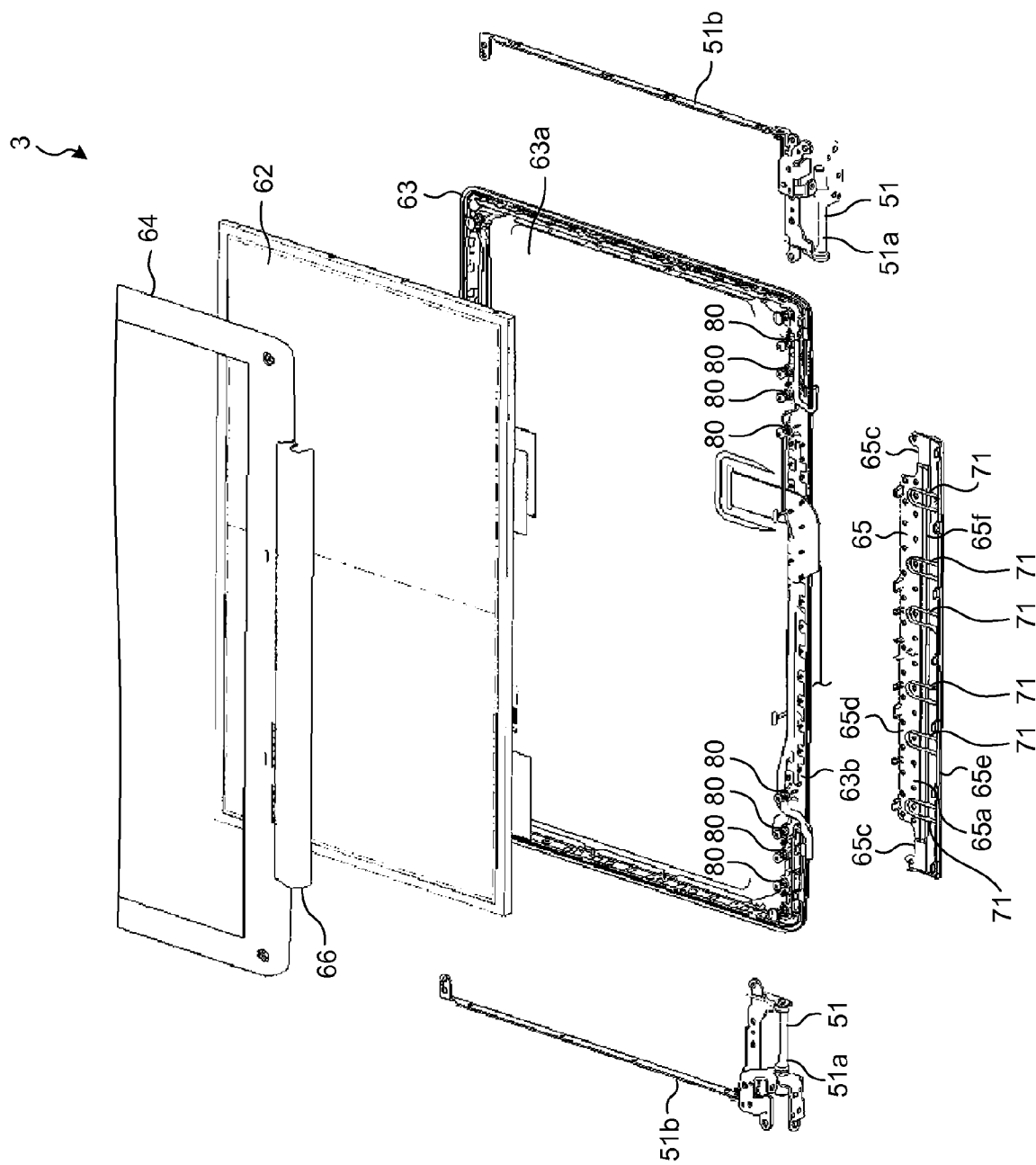
FIG. 3 is an exemplary exploded front perspective view of the second main body in the first embodiment.

The hinge mechanism 4 includes first hinge portions (not illustrated) that are linked to the housing 11 of the first main body 2 and second hinge portions 51 (see FIG. 2) that are linked to the housing 61 of the second main body 3. As illustrated in FIG. 3, each second hinge portion 51 includes a hinge shaft 51a and a sheet metal member 51b that is fixed to the hinge shaft 51a. The shaft centers of the hinge shafts 51a are coincident with the rotation axis Ax. The sheet metal members 51b are formed in an L-shape along the corners of the sides with which the first main body 2 is coupled in the housing 61 of the second main body 3.

As illustrated in FIG. 3, the housing 61 of the second main body 3 includes a base member 63 as a first member having a flat rectangular shape, includes a rectangular frame member 64 that is laminated on a top surface 63a of the base member 63, includes a first hinge cover 65 as a second member that is fixed to that side of the base member 63 which lies toward the center of rotation of the second main body 3, and includes a second hinge cover 66 that is fixed to that side of frame member 64 which lies toward the center of rotation of the second main body 3. In the housing 61, after the display 62 and the second hinge portions 51 are housed in the base member 63 (see FIG. 4), the frame member 64 is fit to the peripheral edge of the base member 63 and the first hinge cover 65 and the second hinge cover 66 are assembled (see FIG. 2). Meanwhile, the base member 63 is a resin molding component.

Figure 5:
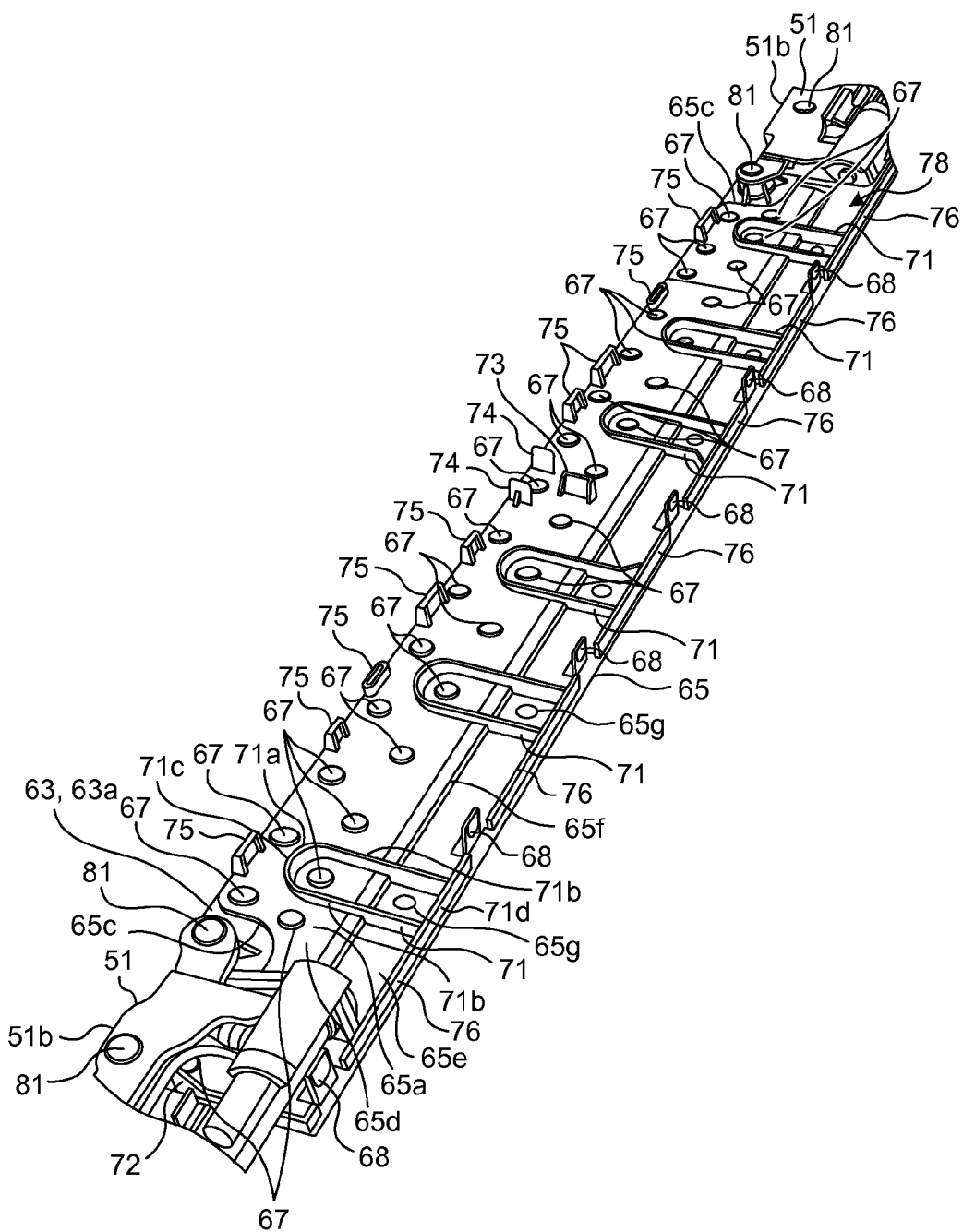
FIG. 5 is an exemplary perspective view of a base member and a first hinge cover in the first embodiment.

On the top surface 63a of the base member 63, a plurality of bosses 80 are erected at both ends along the rotation axis Ax on that side which lies toward the center of rotation of the base member 63. As illustrated in FIG. 5, the second hinge portions 51 of the hinge mechanism 4 are fixed to a part of the bosses 80 with fastening members 81 such as screws. To facilitate screwing in of the fastening members 81, a female screw is formed in each boss 80.

Figure 4:
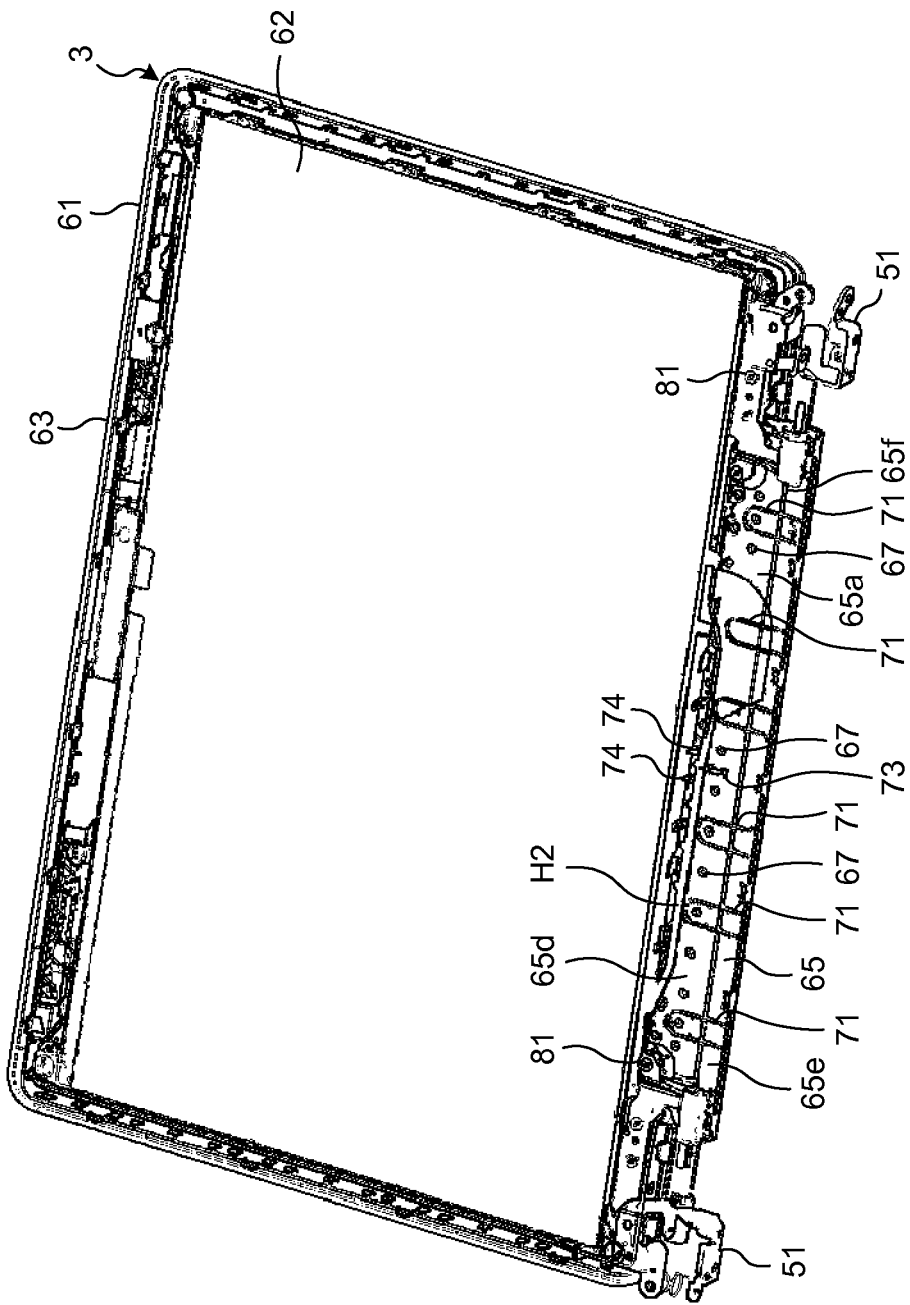
FIG. 4 is an exemplary front perspective view of the second main body from which a frame member is removed in the first embodiment.

As illustrated in FIGS. 3 to 5, the first hinge cover 65 is a plate-like member having a relatively small thickness and is formed in an elongated manner along the rotation axis Ax. Moreover, the first hinge cover 65 is touched to the base member 63. Furthermore, the first hinge cover 65 includes an overlapping portion 65d that overlaps the base member 63 and a projecting portion 65e that is connected to the overlapping portion 65d and that projects outward from the base member 63. On the first hinge cover 65 is formed a level difference 65f that extends along the rotation axis Ax. On both ends in the longitudinal direction of the first hinge cover 65 are formed cutouts 65c while avoiding the second hinge portions 51 and the bosses 80. Meanwhile, the first hinge cover 65 is a resin molding component.

Figure 10A:
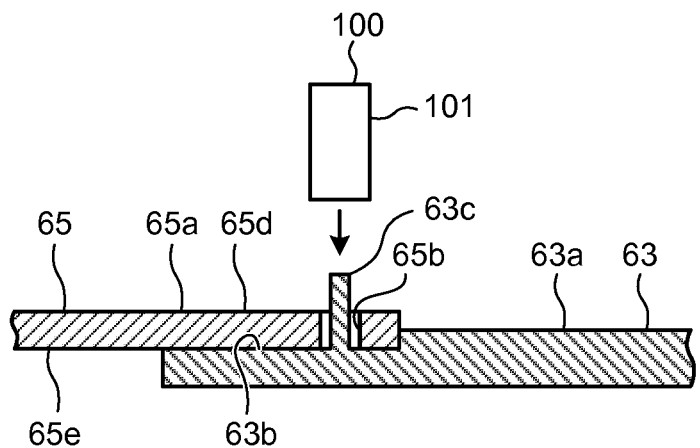
FIG. 10A is an exemplary explanatory diagram illustrating a step of a welding method of the base member and the first hinge cover in the first embodiment.
Figure 10B:
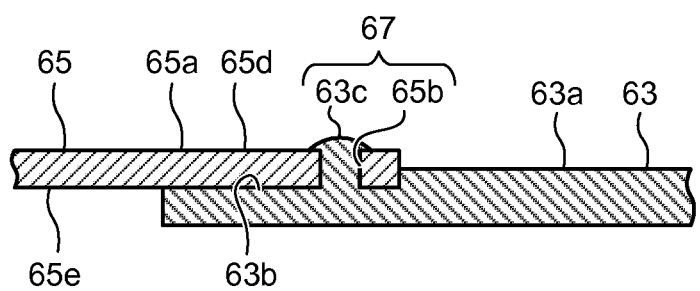
FIG. 10B is an exemplary explanatory diagram illustrating another step of the welding method of the base member and the first hinge cover in the first embodiment.

The first hinge cover 65 is fixed by welding to an attachment portion 63b (see FIG. 3) that is formed on the top surface 63a of the base member 63. As illustrated in FIGS. 10A and 10B, during the welding process, the first hinge cover 65 is placed over the attachment portion 63b of the base member 63 while inserting a welding pin 63c, which is formed in the attachment portion 63b of the base member 63, into a hole 65b that is formed on the first hinge cover 65 (see FIG. 10A). Subsequently, the leading end of the welding pin 63c that protrudes from the first hinge cover 65 is pressed down while being heated with a heating member 101 of a welding device 100. As a result, the welding pin 63c melts and the base member 63 gets welded with the first hinge cover 65 (see FIG. 10B). The post-welding welding pin 63c and the post-welding hole 65b constitute a joint 67 at which the base member 63 and the first hinge cover 65 are welded. Thus, the joint 67 links the first hinge cover 65 to the base member 63 at an overlapping portion between the first hinge cover 65 and the base member 63. As illustrated in FIG. 3, the hole 65b formed on the first hinge cover 65 as well as the welding pin 63c formed on the base member 63 is disposed in plurality. Thus, as illustrated from FIGS. 4 to 6, the joint 67 is formed in plurality. Such joints 67 get exposed on a surface 65a of the first hinge cover 65 that lies on side opposite to the side of the base member 63.

At least a part of the joints 67 are arranged in a plurality of rows along the longitudinal direction of the first hinge cover 65 (i.e., along the rotation axis Ax). In the present embodiment, at least some of the joints 67 are arranged in a two-row zigzag arrangement. Among the joints 67 arranged in a plurality of rows (as the specific example, two rows), the distance between adjacent joints 67 is smaller at the ends of the rows than at the center of the rows as illustrated in FIG. 6.

Figure 6:
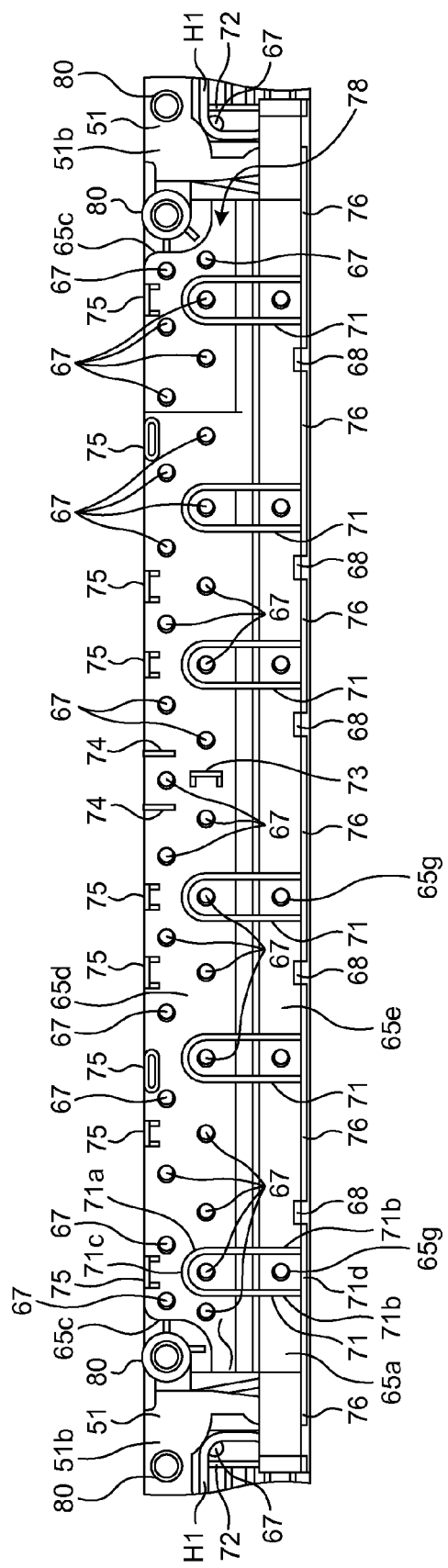
FIG. 6 is an exemplary plan view of the base member and the first hinge cover in the first embodiment.

As illustrated in FIGS. 5 and 6, a plurality of claws 68 are vertically formed on the front end edge in the projecting direction of the projecting portion 65e in the projecting portion 65e of the first hinge cover 65. The claws 68 are arranged at intervals along the longitudinal direction of the first hinge cover 65. The claws 68 get locked at locking portions (not illustrated) formed on the second hinge cover 66. Because of that, the first hinge cover 65 and the second hinge cover 66 are locked together.

On the surface 65a of the first hinge cover 65 are erected a plurality of first ribs 71, which are arranged at intervals along the longitudinal direction of the first hinge cover 65. More particularly, in the longitudinal direction of the first hinge cover 65, the first ribs 71 and the claws 68 are alternately arranged.

Each first rib 71 encloses at least a part of circumference of a joint 67 arranged in one of the plurality of rows. More particularly, each first rib 71 is formed in a ring-like pattern surrounding a single joint 67 in one of the rows of the joints 67.

Figure 7:
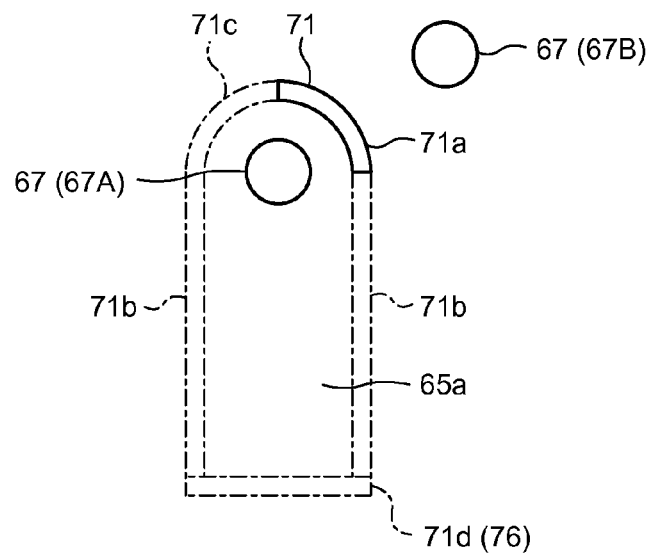
FIG. 7 is an exemplary explanatory diagram illustrating a positional relation between a first rib and joints in the first embodiment.

As illustrated in FIGS. 6 and 7, each first rib 71 includes a curved rib 71a that is erected on the surface 65a of the first hinge cover 65 and that has a curved shape over the surface 65a of the first hinge cover 65 in between a pair of adjacent joints 67. More particularly, the curved inner surface of the curved rib 71a faces the side of a joint (a specific joint) 67 in a pair of adjacent joints 67 and has a curved shape enclosing a part of circumference of the specific joint 67. The curved shape of the curved rib 71a is a bending shape. The first rib 71 surrounds the specific joint 67.

More particularly, each first rib 71 is formed in a ring-like pattern and includes a pair of opposite wall portions 71b that stand facing each other across the specific joint 67 and that extend from the overlapping portion 65d toward the projecting portion 65e; includes a first connection portion 71c that is formed in the overlapping portion 65d and that connects the ends at one side of the pair of opposite wall portions 71b; and includes a second connection portion 71d that connects the ends at the other side of the pair of opposite wall portions 71b. Each first rib 71 is formed to a size that allows the heating member 101 to insert in the corresponding first rib 71.

The first connection portion 71c includes the curved rib 71a and is formed in an arc-like bend connecting the pair of opposite wall portions 71b. The second connection portion 71d constitutes a part of a sixth rib 76, which is formed on one side of the surface 65a of the first hinge cover 65. In the longitudinal direction of the first hinge cover 65, the sixth ribs 76 and the claws 68 are alternately arranged.

Figure 8:
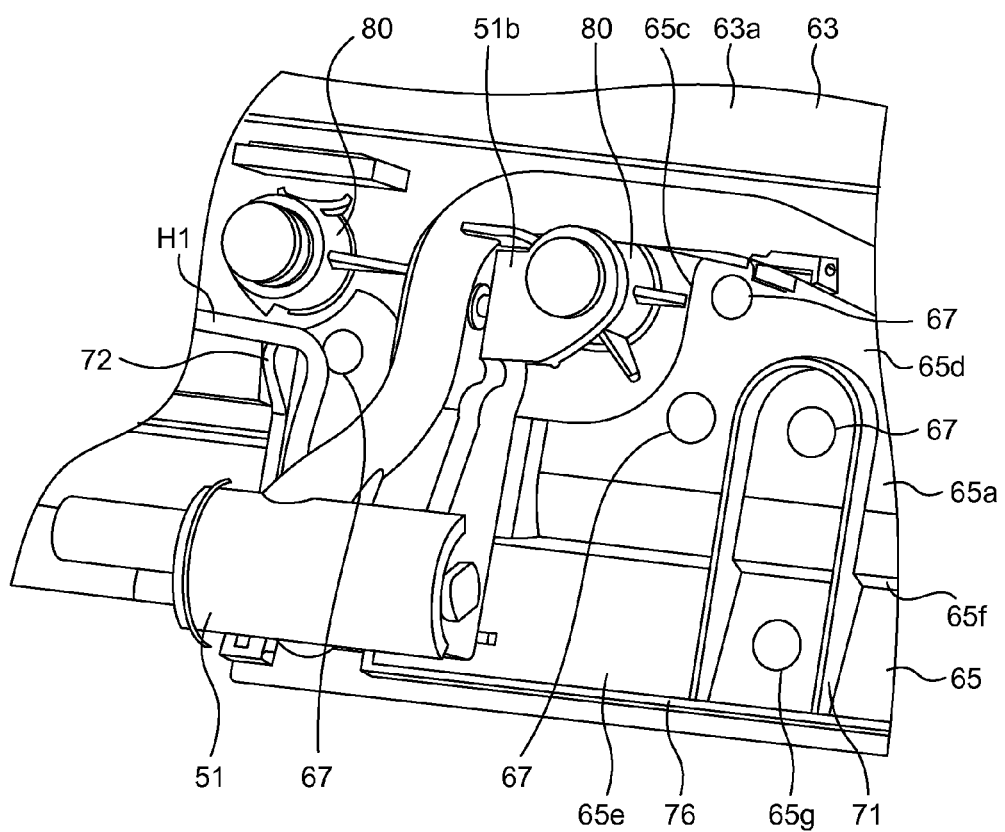
FIG. 8 is an exemplary perspective view of one end of the first hinge cover and the surrounding thereof in the first embodiment.
Figure 9:
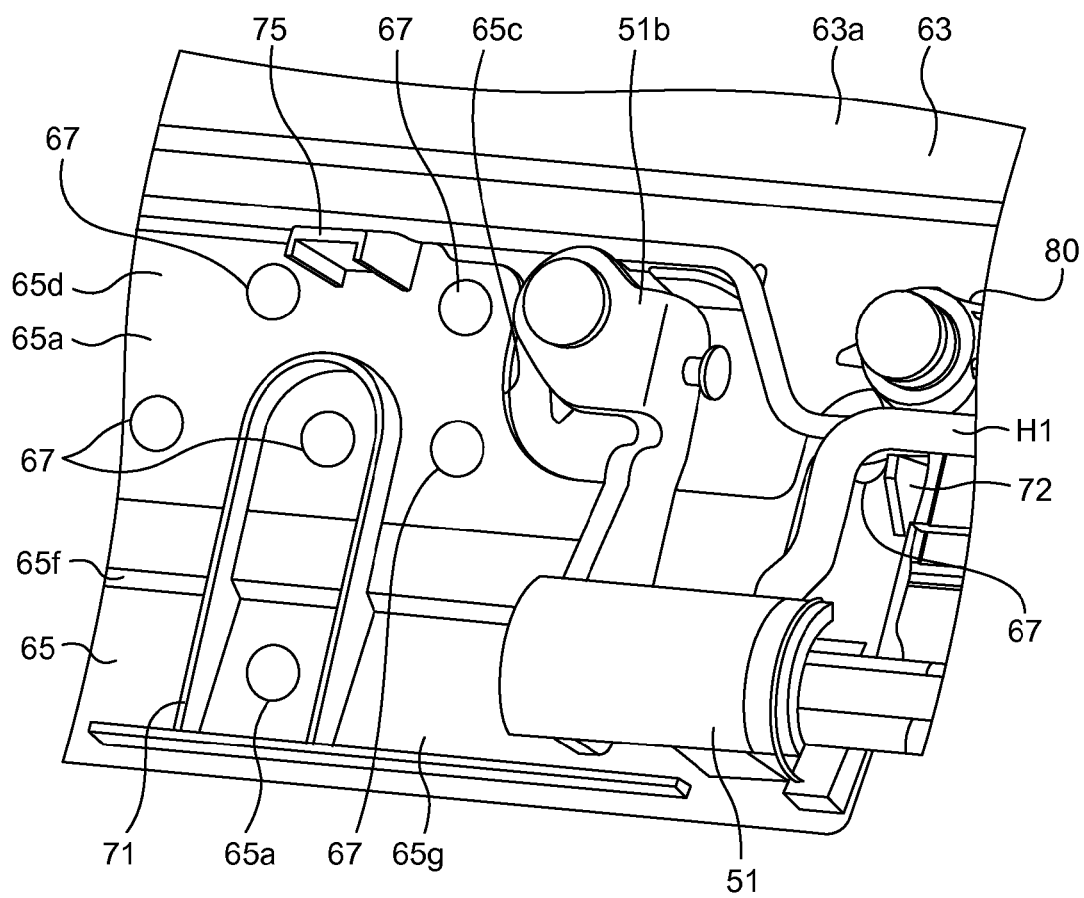
FIG. 9 is an exemplary perspective view of the other end of the first hinge cover and the surrounding thereof in the first embodiment.

As illustrated in FIG. 6 or in FIG. 8, a harness H1 is routed on the side of the surface 65a of the first hinge cover 65.

Moreover, on the surface 65a are erected second ribs 72 that touch the harness H1 for restricting the movement of the harness H1. The second ribs 72 are erected on the surface 65a on the outside of the row of the first ribs 71. Herein, for example, the harness H1 is routed for radio antenna (not illustrated).

As illustrated in FIGS. 5 and 6, in the center of the longitudinal direction of the first hinge cover 65 are formed a third rib 73 and a pair of fourth ribs 74. More particularly, the third rib 73 and the fourth ribs 74 are formed on the overlapping portion 65d at positions representing corners of a triangle. The third rib 73 and the pair of fourth ribs 74 sandwich a harness H2 (see FIG. 4) routed therebetween and restrict the movement of the harness H2. Herein, for example, the harness H2 is routed for the display 62.

As ribs of another type, a plurality of fifth ribs 75 are erected on the surface 65a of the first hinge cover 65 and at the other edge of the first hinge cover 65. The fifth ribs 75 touch the harness H2 for restricting the movement of the harness H2.

Herein, the first ribs 71 and the third rib 73 are arranged along the rows of the joints 67 and collectively constitute a rib group 78. In each rib group 78, the distance between adjacent ribs (between two first ribs 71 or between a first rib 71 and the third rib 73) is larger at the end of the row of the ribs than at the center of the row of the ribs.

All ribs starting from the first ribs 71 up to the sixth ribs 76 are integratedly formed on the first hinge cover 65. More particularly, the ribs starting from the first ribs 71 up to the sixth ribs 76 and the first hinge cover 65 are formed as a single resin molding component with the use of a mold tool. Herein, while separating the resin molding component from the mold in the mold tool, eject pins are used to press and demold the resin molding component. In the present embodiment, the vicinity of each of the first ribs 71 of the first hinge cover 65 is pressed by the eject pin. As an example, the inside of each of the ring-like first ribs 71 is pressed by the eject pin. Because the vicinity of the first ribs 71 is pressed, the first rib 71 prevents deformation of the first hinge cover 65 that is yet to completely set. Thus, in the post-molding first hinge cover 65, a pressing trace 65g of the eject pin appears in the vicinity of each of the first ribs 71. More particularly, the pressing trace 65g of the eject pin appears on the inside of each of the first ribs 71.

Herein, if stated in a different way, the electronic device 1 comprises the base member 63 as the first member; comprises the first hinge cover 65 as the second member that is touched to the base member 63; comprises the joints 67 as a plurality of connecting portions that are spaced apart from each other and that connect the base member 63 and the first hinge cover 65 at the overlapping portions between the base member 63 and the first hinge cover 65; and comprises the curved ribs 71a that have a bending shape, that protrude from the surface 65a of the first hinge cover 65, and that are arranged in between the joints 67.

If stated in still another way; the electronic device 1 can be described as follows. Herein, in order to distinguish between the joints 67, a first joint 67A and a second joint 67B as illustrated in FIG. 7 are used in the following description. Thus, the electronic device 1 comprises the base member 63 as the first member; comprises the first hinge cover 65 as the second member that is touched to the base member 63; comprises the first joint 67A as a first linking portion that links the base member 63 and the first hinge cover 65 at an overlapping portion between the base member 63 and the first hinge cover 65; comprises the second joint 67B as a second linking portion that links the base member 63 and the first hinge cover 65 at a different position of the overlapping portion between the base member 63 and the first hinge cover 65 than the position linked by the first joint 67A; and comprises the curved rib 71a that has a bending shape, that protrudes from the surface 65a of the first hinge cover 65, and that is arranged in between the first joint 67A and the second joint 67B.

As described above, in the present embodiment, the curved rib 71a is erected on the surface 65a of the first hinge cover 65 and has a curved shape over the surface 65a of the first hinge cover 65 in between the joints 67. Consequently, it becomes possible to directly enhance the resistance property in between the joints 67 of the first hinge cover 65 which has been linked to the base member 63 with the joints 67. Besides, since the curved rib 71a can hold out against bending occurring in a plurality of directions, the curved rib 71a is more advantageous than a linear rib that can effectively holds out against bending in only a single direction. Thus, according to the first embodiment, in the electronic device 1, the resistance property in between the joints 67 of the first hinge cover 65 which has been linked to the base member 63 with the joints 67 can be efficiently enhanced as compared to the conventional configuration. That eventually enables achieving enhancement in the strength of the first hinge cover 65.

Meanwhile, in the present embodiment, since the curved rib 71a has a bending shape; the curved rib 71a is not prone to stress concentration as compared to, for example, a case when the curved rib 71a is bent in right angle. Hence, as compared to the case when the curved rib 71a is bent in right angle, it becomes possible to enhance the strength of the first hinge cover 65.

Moreover, in the present embodiment, the first hinge cover 65 includes the overlapping portion 65d that is layered around the base member 63 and the projecting portion 65e that is connected to the overlapping portion 65d and that projects outward from the base member 63. Each first rib 71 includes the pair of opposite wall portions 71b that stand facing each other across a joint 67 and that extend from the overlapping portion 65d toward the projecting portion 65e and includes the first connection portion 71c that has the curved rib 71a and that is formed on the overlapping portion 65d and that connects the ends at one side of the opposite wall portions 71b. Hence, the opposite wall portions 71b that have the ends at one side connected by the first connection portion 71c enable achieving enhancement in the strength of the projecting portion 65e.

Furthermore, in the present embodiment, each first connection portion 71c is formed in an arc-like bend connecting the corresponding pair of opposite wall portions 71b. Hence, as compared to a case when the first connection portion 71c is bent in right angle, the advantage is that the first connection portion 71c is not prone to stress concentration.

Moreover, in the present embodiment, each first rib 71 includes the second connection portion 71d that connects the ends at the other side of the opposite wall portions 71b. Besides, each first rib 71 is formed in a ring-like pattern surrounding a single joint 67. Hence, as compared to a case when the first rib 71 is not formed in a ring-like pattern, it becomes possible to enhance the strength of the first hinge cover 65.

Furthermore, in the first embodiment, the electronic device 1 comprises the plurality of joints arranged in a plurality of rows and each first rib 71 encloses at least a part of a circumference of a joint 67 arranged in one of the plurality of rows. Hence, in the first hinge cover 65, it becomes possible to efficiently enhance the strength surrounding a single row of the joints 67.

Moreover, in the present embodiment, the joints 67 that are arranged in the plurality of rows are arranged in a zigzag arrangement. Herein, the minimum distance between two adjacent joints 67 is determined according to the settings of the manufacturing tool (mold tool). Hence, as compared to a case when the joints are arranged in two rows with identical arrangement instead of the zigzag arrangement, it becomes possible to reduce the distance between adjacent joints 67 in the direction of rows from the perspective of the entire zigzag arrangement. That enables achieving efficient fixing of the first hinge cover 65 to the base member 63.

Furthermore, in the present embodiment, among the joints 67 arranged in the plurality of rows, the distance between adjacent joints 67 is smaller at the ends of the rows than at the center of the rows. That enables achieving a high strength of linking between the first hinge cover 65 and the base member 63 at the ends of the rows of the joints 67.

Moreover, in the present embodiment, the electronic device 1 comprises the rib group 78 composed of a plurality of ribs including the first ribs 71 (i.e., composed of the plurality of first ribs 71 and the third rib 73). In the rib group 78, the plurality of ribs (i.e., the plurality of first ribs 71 and the third rib 73) are arranged along the direction of rows of the joints 67. Besides, in the plurality of ribs (i.e., the plurality of first ribs 71 and the third rib 73) arranged along the direction of rows of the joints 67, the distance between adjacent ribs (between two first ribs 71 or between a first rib 71 and the third rib 73) is larger at the end of the row of the ribs than at the center of the row of the ribs. Hence, it becomes possible to strengthen the areas in which the distance between adjacent joints 67 is large.

Furthermore, in the present embodiment, the electronic device 1 comprises the harness H1 that is routed on the side of the surface 65a of the first hinge cover 65, comprises the plurality of first ribs 71 that are arranged in the plurality of rows, and comprises the second ribs 72 that are erected on the surface 65a along the direction of rows of the first ribs 71 and on the outside of the rows of the first ribs 71. The second ribs 72 touch the harness H1 for restricting the movement of the harness H1. That prevents the harness H1 from touching other components (e.g., the hinge mechanism 4).

Moreover, in the present embodiment, the first hinge cover 65 is a resin molding component manufactured using a mold tool. In the post-molding first hinge cover 65, the pressing traces 65g of the eject pins appear on the inside of the first ribs 71. That is, during manufacturing, the eject pins press the inside of the first ribs 71 and demold the first hinge cover 65 from the mold. Because of that, the first hinge cover 65 is prevented from getting deformed.

Second Embodiment

Figure 11:
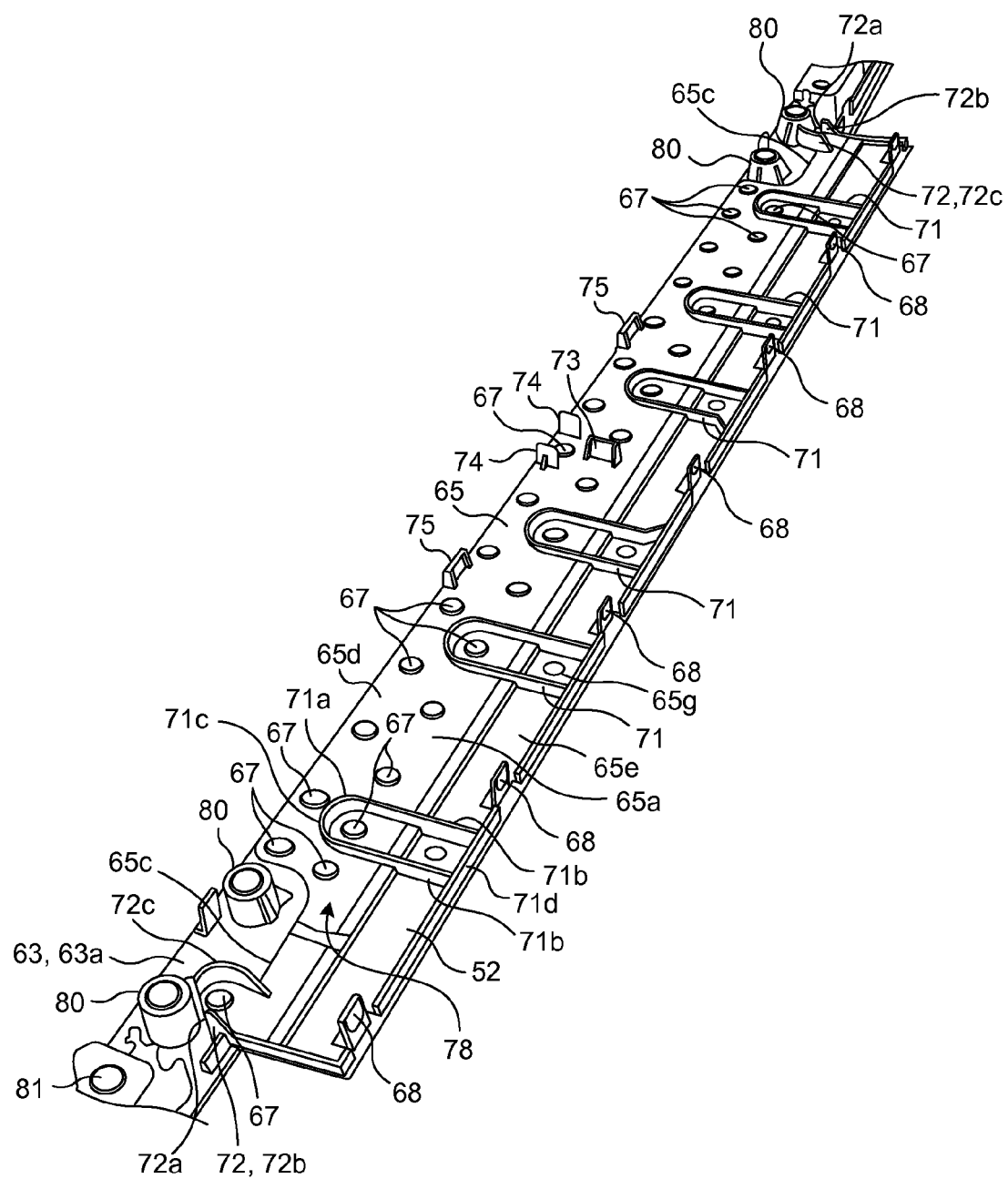
FIG. 11 is an exemplary perspective view of the first hinge cover according to a second embodiment.

Described below with reference to FIG. 11 is an electronic device according to a second embodiment.

As illustrated in FIG. 11, the shape of the second ribs 72 in the first hinge cover 65 according to the present embodiment differs than the shape of the second ribs 72 according to the first embodiment. In the present embodiment, each of the second ribs 72 is formed in a planar U-shape surrounding area part of the joint 67. Moreover, in each second rib 72 is formed a cutout 72a so that the second rib 72 is divided into two portions 72b and 72c. With the cutouts 72a, the second ribs 72 restrict the movement of the harness H1 (see FIG. 5). Even in such a configuration, it is possible to achieve the same effect as described in the first embodiment.

Moreover, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising:
    a first member;
    a second member comprising an overlapping portion that overlaps the first member and a projecting portion that is connected to the overlapping portion and that projects outward from the first member,
    a plurality of joints that are spaced apart from each other and that link the first member and the second member at the overlapping portion between the first member and the second member; and
    a first rib that is provided on a surface of the second member and that extends along the surface, the first rib comprising a pair of opposite wall portions that face each other across one of the joints and that extend from the overlapping portion toward the projecting portion, and a curved portion that is provided on the surface of the second member in between the joints and that connects ends of the pair of opposite wall portions.

2. The electronic device of claim 1, wherein the curved portion is formed in a curved shape enclosing a part of a circumference of one of a pair of the joints.

3. The electronic device of claim 1, wherein the curved portion is curved in an arc to connect the pair of opposite wall portions.

4. The electronic device of claim 1, wherein the first rib comprises a connection portion that connects other ends of the pair of opposite wall portions, and
    the first rib is formed in a ring-like pattern surrounding the joint.

5. The electronic device of claim 1, wherein
    the joints are arranged in a plurality of rows, and
    the first rib encloses at least a portion of a circumference of the joint arranged in one of the rows.

6. The electronic device of claim 5, wherein the joints arranged in the rows are arranged in a zigzag pattern.

7. The electronic device of claim 5, wherein a distance between an adjacent pair of the joints at an end of each of the rows is smaller than a distance between an adjacent pair of the joints at a center of each of the rows.

8. The electronic device of claim 7, further comprising:
    a rib group comprising a plurality of ribs comprising the first rib, the ribs being arranged along a direction of the rows of the joints, wherein
    a distance between an adjacent pair of the ribs at an end of a row of the ribs is larger than a distance between an adjacent pair of the ribs at a center of the row.

9. The electronic device of claim 1, wherein
    the first rib comprises a plurality of first ribs that are arranged in a row, the electronic device further comprising:
- a harness routed on a side of the surface of the second member; and
- a second rib that is erected on the surface of the second member at a portion on the outside of a row of the first ribs in the direction of the row of the first ribs and that touches the harness to restrict movement of the harness.

10. The electronic device of claim 1, wherein the first rib is provided as a protrusion protruding from the surface of the second member in a direction substantially normal to the surface, and provided separated from the joints along the surface of the second member.

11. The electronic device of claim 10, wherein the projecting portion is configured to projects outward from the first member in a width direction of the overlapping portion.

12. An electronic device comprising:
- a first member;
- a second member comprising an overlapping portion that overlaps the first member and a projecting portion that is connected to the overlapping portion and that projects outward from the first member;
- a plurality of joints that are spaced apart from each other and that link the first member and the second member at the overlapping portion between the first member and the second member; and
- a first rib that is provided on a surface of the second member in between the joints, the first rib comprising a pair of wall portions that face each other and that extend toward the projecting portion, and a curved portion that connects the pair of wall portions.

13. The electronic device of claim 12, wherein the curved portion is formed in a curved shape enclosing a part of a circumference of one of a pair of the joints.

14. The electronic device of claim 12, wherein the curved portion is curved in an arc to connect the pair of wall portions.

15. The electronic device of claim 12, wherein
   the first rib comprises a connection portion that connects ends of the pair of wall portions, and
   the first rib is formed in a ring-like pattern surrounding the joint.

16. The electronic device of claim 12, wherein the first rib is provided as a protrusion protruding from the surface of the second member in a direction substantially normal to the surface, and provided separated from the joints along the surface of the second member.

17. The electronic device of claim 16, wherein the projecting portion is configured to projects outward from the first member in a width direction of the overlapping portion.

* * * * *